United States Patent
Kim

(10) Patent No.: US 8,369,910 B2
(45) Date of Patent: Feb. 5, 2013

(54) CELLULAR PHONE

(75) Inventor: Eun-Ah Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/077,671

(22) Filed: Mar. 31, 2011

(65) Prior Publication Data

US 2011/0275417 A1     Nov. 10, 2011

(30) Foreign Application Priority Data

May 7, 2010   (KR) .................. 10-2010-0043011

(51) Int. Cl.
*H04M 1/00*     (2006.01)
(52) U.S. Cl. ................ 455/575.4; 455/566; 455/575.3; 455/575.1
(58) Field of Classification Search .......... 455/566, 455/575.4, 25, 466, 575.3, 575.1, 262; 349/54, 349/143, 113, 15, 117, 86; 313/582, 505; 345/173, 1.3, 94, 427

See application file for complete search history.

(56) References Cited

U.S. PATENT DOCUMENTS

| 2006/0270305 A1* | 11/2006 | Imamura ................... 445/25 |
| 2008/0013001 A1* | 1/2008 | Jang et al. .................. 349/15 |
| 2008/0051164 A1* | 2/2008 | Joo et al. ................. 455/575.4 |

FOREIGN PATENT DOCUMENTS

| KR | 1020090070887 A | 7/2009 |
| KR | 1020100032173   | 3/2010 |

OTHER PUBLICATIONS

Korean Notice of Allowance issued on Feb. 27, 2012 in connection with Korean Patent Application Serial No. 10-2010-0043011 and Request for Entry of the Accompanying Office Action attached herewith.

* cited by examiner

*Primary Examiner* — Kiet Doan
(74) *Attorney, Agent, or Firm* — Robert E. Bushnell, Esq.

(57) ABSTRACT

A cellular phone capable of observing a background. The cellular phone includes a first main body and a second main body slidably connected to the first main body. A display is provided to the second main body. The display is divided into a first area that is not overlapped with the first main body when the second main body is slidably open, and a second area that is overlapped with the first main body when the second main body is slidably open. In the cellular phone, the first area has first pixels formed into a transparent structure in which a background is observed, and the second area has second pixels formed into a non-transparent structure in which the background is not observed.

20 Claims, 7 Drawing Sheets

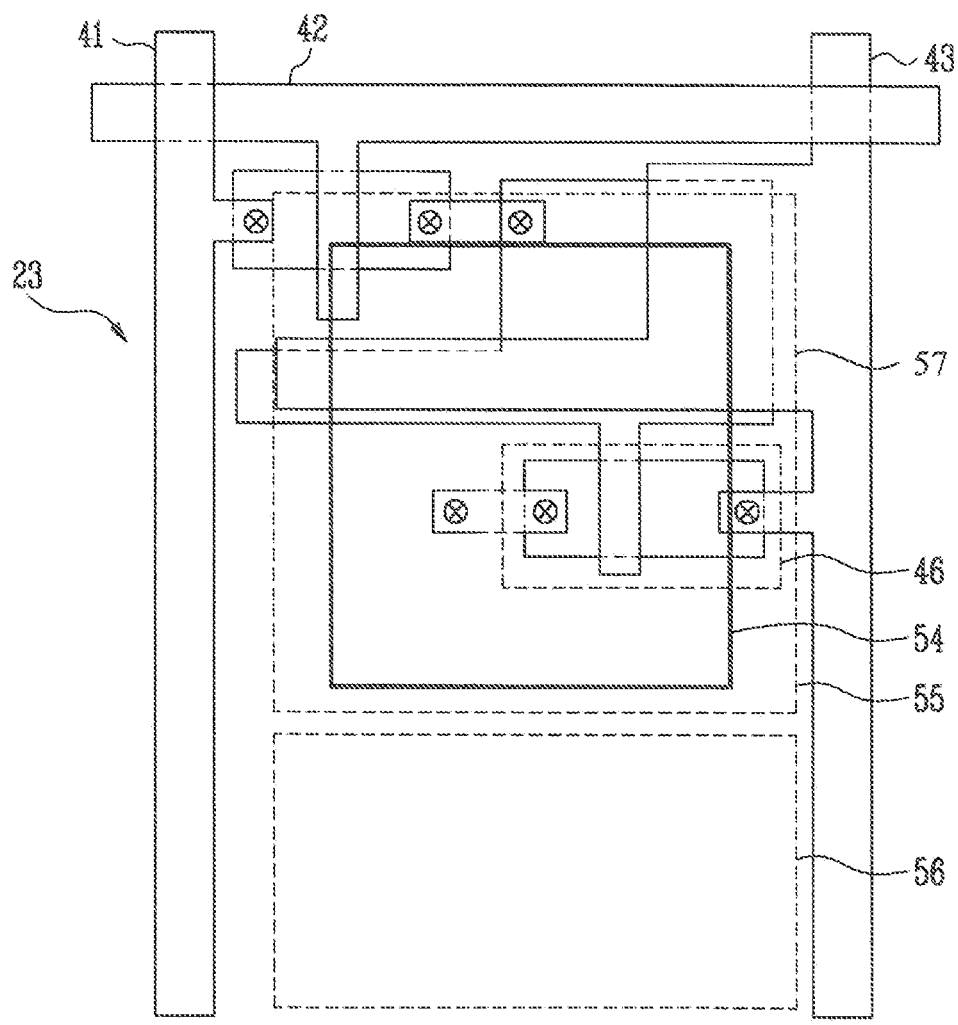

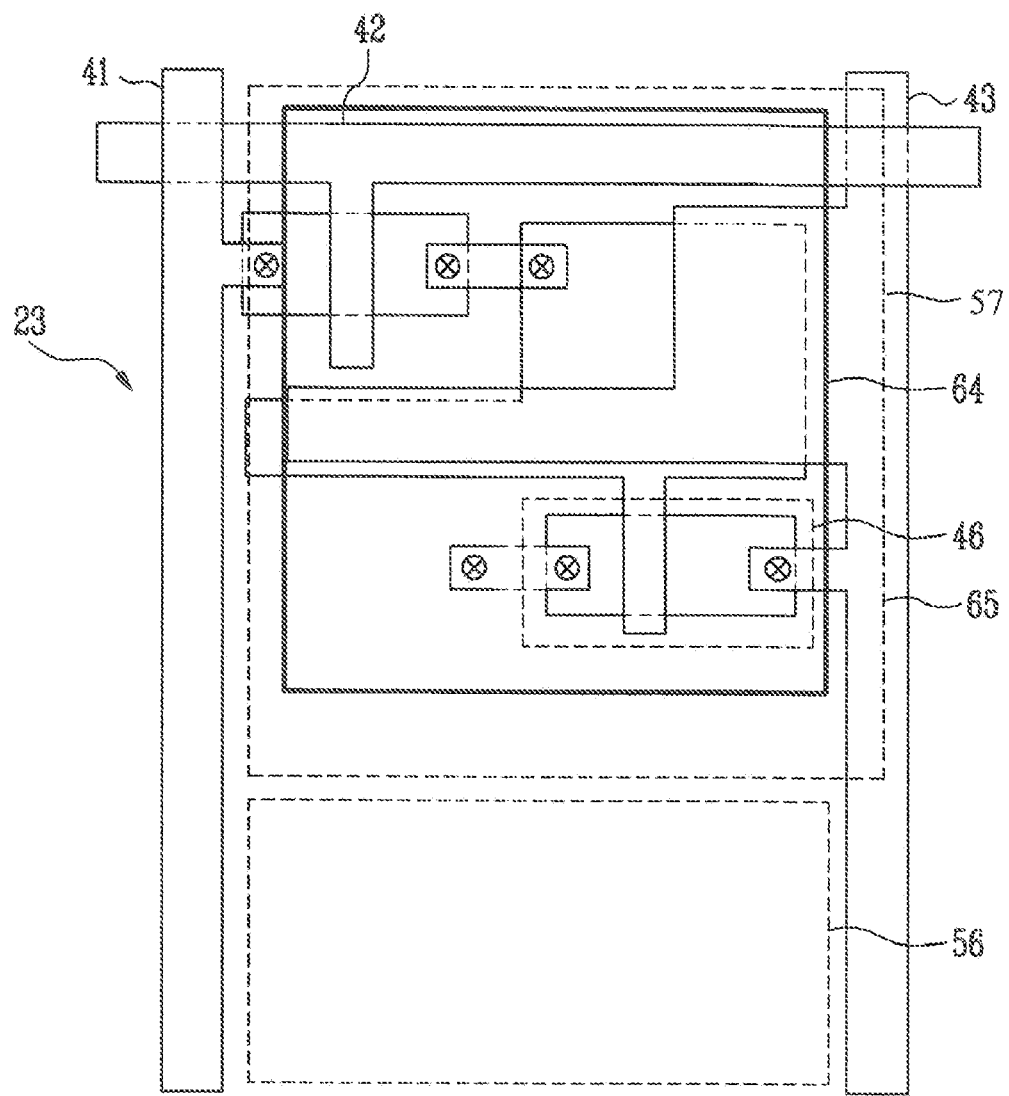

CELLULAR PHONE

CLAIM OF PRIORITY

This application makes reference to, incorporates the same herein, and claims all benefits accruing under 35 U.S.C. §119 from an application for CELLULAR PHONE earlier filed in the Korean Intellectual Property Office on 7 May 2010 and there duly assigned Serial No. 10-2010-0043011.

BACKGROUND OF THE INVENTION

1. Field of the Invention

An aspect of the present invention relates to a cellular phone, and more particularly, to a cellular phone capable of observing a background.

2. Description of the Related Art

Recently, there have been developed various types of flat panel display devices capable of reducing the weight and volume of cathode ray tubes, which are disadvantages. The flat panel display devices include a liquid crystal display, a field emission display, a plasma display panel, an organic light emitting display, and the like.

Among these flat panel display devices, the organic light emitting display device displays images by using organic light emitting diodes that emit light through recombination of electrons and holes. The organic light emitting display device has a fast response speed and is driven with low power consumption. Since the organic light emitting display has an advantage of low power consumption, the organic light emitting display is frequently used for portable devices, e.g., cellular phones and the like.

Generally, cellular phones are classified into a bar type, a flip type, a folder type and a slide type according to their outer appearances. Here, a slide type cellular phone performs a predetermined function when a main body is slidably open.

In a contemporary slide type cellular phone, however, a predetermined screen is displayed on a display when a main body is slidably open, and hence, the applications of the contemporary slide type cellular phone are restricted. Therefore, in order to extend applications, it is required to develop a cellular phone in which an object disposed at a backside of the cellular phone can be displayed via a display when a main body is slidably open.

SUMMARY OF THE INVENTION

It is an aspect of the present invention to provide an improved cellular phone.

It is another aspect of the present invention to provide a cellular phone capable of observing a background.

According to an aspect of the present invention, there is provided a cellular phone including a first main body, a second main body slidably connected to the first main body, and a display provided to the second main body. The display may be divided into a first area that is not overlapped with the first main body when the second main body is slidably open, and a second area that is overlapped with the first main body when the second main body is slidably open. The first area has first pixels formed into a transparent structure in which a background is observed through the first pixels, and the second area has second pixels formed into a non-transparent structure in which the background is not observed.

At least one of the first pixels may be positioned in a pixel area defined by a scan line, a data line and a power line. The pixel area may have a first section in which transistors, and anode electrode and a light emitting layer are formed, and a second section in which only a transparent insulating layer is formed. The second section may be set to have a narrower area than the first section. The anode electrode formed in the second section may be overlapped with the scan line and the power line, and the light emitting layer may be overlapped with the scan line. When the second main body is not slidably open, an area overlapped with the first area in the first main body may be set as black. At least one of the second pixels may be positioned in a pixel area defined by a scan line, a data line and a power line, and transistors, an anode electrode and a light emitting layer may be formed in the pixel area.

According to another aspect of the present invention, there is provided a cellular phone including a first main body, a second main body slidably connected to the first main body, and a display provided to the second main body. The display may be divided into a first area that is not overlapped with the first main body when the second main body is slidably open, and a second area that is overlapped with the first main body when the second main body is slidably open. The first area has second pixels formed into a non-transparent structure in which a background is not observed, and the second area has first pixels formed into a transparent structure in which the background is observed through the first pixels.

At least one of the first pixels may be positioned in a pixel area defined by a scan line, a data line and a power line. The pixel area may a first section in which transistors, and anode electrode and a light emitting layer are formed, and a second section in which only a transparent insulating layer is formed.

When the second main body is not slidably open, an area overlapped with the second area in the first main body may be set as black. When the second main body is slidably open, the shape of predetermined function keys may be shown in an area overlapped with the second area in the first main body.

In a cellular phone according to the present invention, a display through which a background is observed in a partial area is employed, so that the cellular phone can be applied in various fields. For example, an observer may take a photograph while observing a background. Alternatively, the observer may obtain information of a currently observed background using program such as augmented reality.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein;

FIG. 3A is a view showing a first pixel shown in FIG. 1A, constructed as an embodiment according to the principles of the present invention;

FIG. 3B is a view showing a first pixel shown in FIG. 1A, constructed as another embodiment according to the principles of the present invention;

DETAILED DESCRIPTION OF THE INVENTION

Figure 1A:
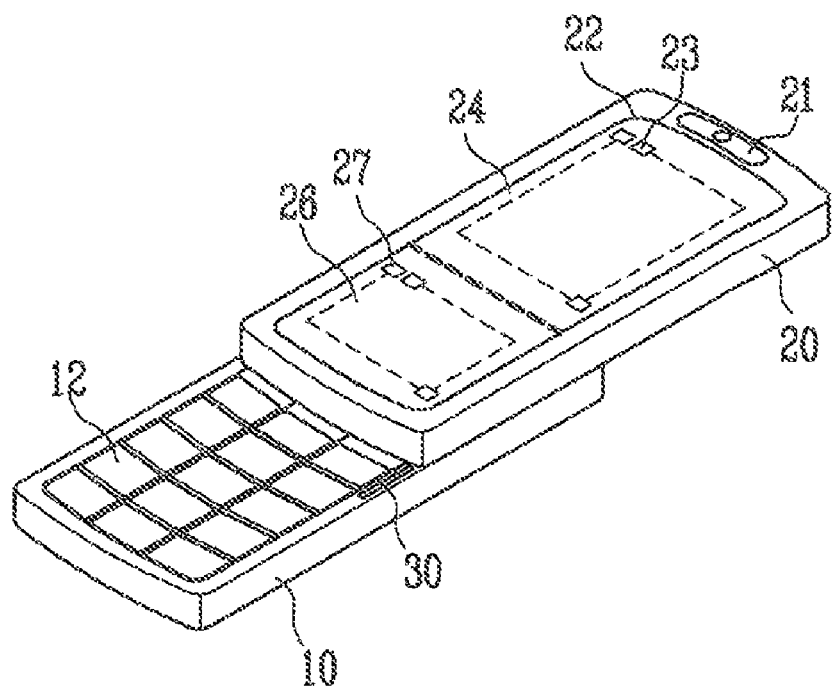
FIGS. 1A and 1B are oblique views showing a cellular phone constructed as an embodiment according to the principles of the present invention, in which FIG. 1A schematically illustrates the cellular phone in an open status, and FIG. 1B schematically illustrates the cellular phone in a close position.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Figure 1B:
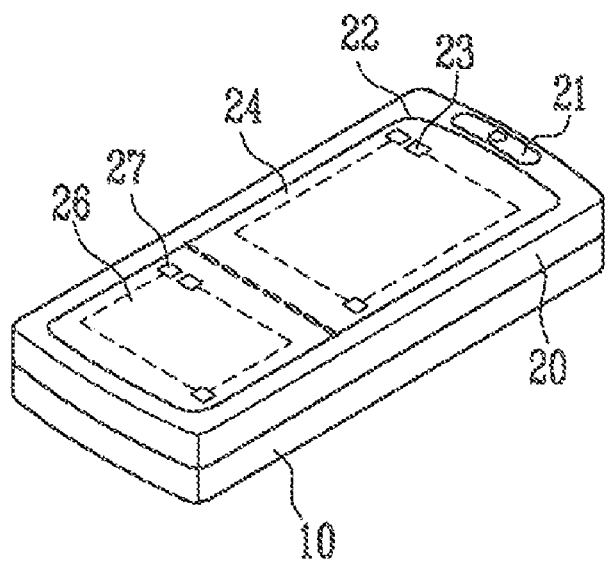

FIGS. 1A and 1B are oblique views showing a cellular phone constructed as an embodiment according to the principles of the present invention, in which FIG. 1A schematically illustrates the cellular phone in an open status, and FIG. 1B schematically illustrates the cellular phone in a close position.

Referring to FIGS. 1A and 1B, the cellular phone according to the embodiment of the present invention includes a first main body 10 and a second main body 20 slidably connected to first main body 10 while coming in contact with first main body 10.

A key pad 12 and a guide groove 30 are formed in first main body 10. Here, predetermined information is inputted through key pad 12, and guide groove 30 is extended in a slide direction of second main body 20.

Key pad 12 is formed in a region opposite to second main body 20 and has a plurality of keys through which a plurality of pieces of information are inputted. That is, key pad 12 is formed in a surface of first main body 10 that is opposite to and facing second main body 20. For example, number keys and/or function keys may be included in key pad 12. Guide groove 30 is positioned at an edge in the region opposite to second main body 20. Guide groove 30 serves as a slider so that second main body 20 can be opened/closed therethrough.

Second main body 20 displays predetermined information while being slid along guide groove 30. To this end, second main body 20 is provided with a display 22 and a speaker 21.

Speaker 21 outputs sound information corresponding to an image or phone displayed on display 22.

Display 22 is formed as an organic light emitting display and displays predetermined information under the control of a user. Display 22 is divided into a first area 24 and a second area 26.

First area 24 refers to an area that is not overlapped with first main body 10 when second main body 20 is slid (i.e., slidably opened). In the present specification and the pending claim, the term "slid" or "slidably open" refers to a situation in which second main body 20 is slid relative to first main body 10 in an "open" position, such that first main body 10 is exposed to an observer to the maximum. First pixels 23 are formed in first area 24. First pixels 23 are formed into a structure in which a background is observed when second main body 20 is slid (i.e., opened). In the present specification and the claims, the language "a background is observed" refers to a situation in which an object disposed at the backside of second main body 20 can be observed by an observer through second main body.

Second area 26 refers to an area that is overlapped with first main body 10 when second main body 20 is slid. Second pixels 27 different from first pixels 23 are formed in second area 26. Second pixels 27 are formed with pixels of the organic light emitting display which has been generally known widely in the art. That is, second pixels 27 are formed in a structure in which a background is not observed.

Figure 2:
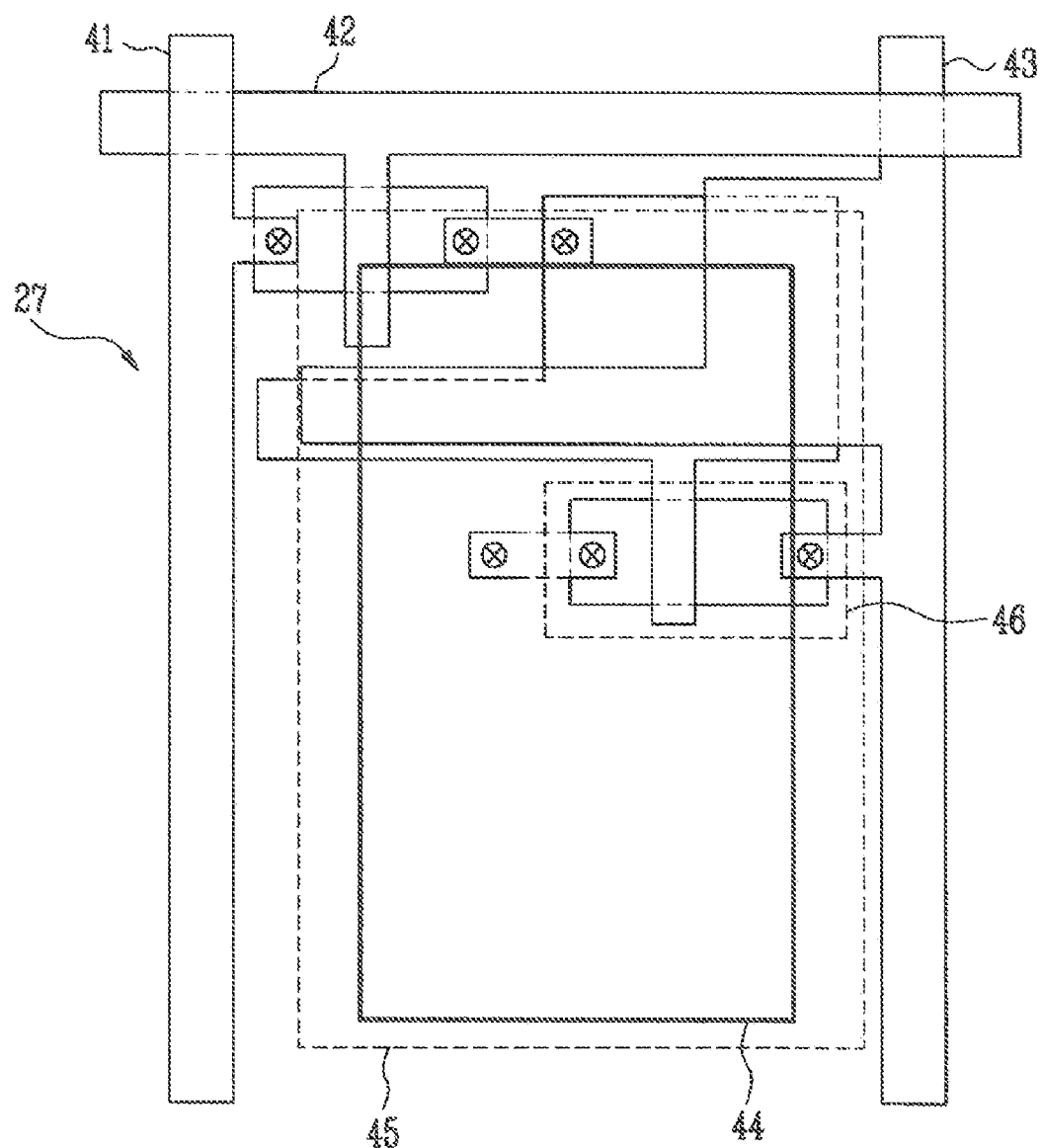
FIG. 2 is a view showing a second pixel shown in FIG. 1A, constructed as an embodiment according to the principles of the present invention.
Figure 4:
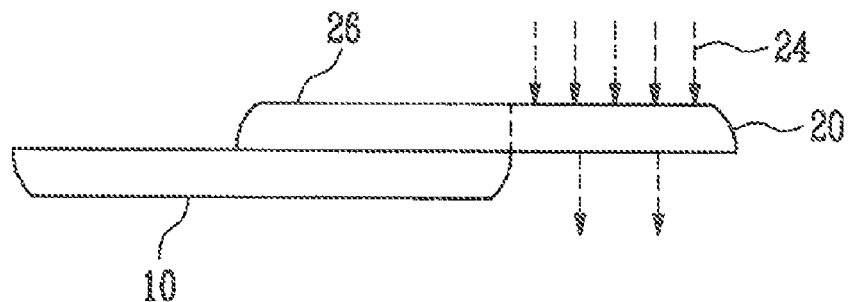
FIG. 4 is a side view of the cellular phone shown in FIG. 1A.

FIG. 2 is a view showing a second pixel shown in FIG. 1A, constructed as an embodiment according to the principles of the present invention.

Referring to FIG. 2, second pixel 27 is formed in a pixel region defined by a scan line 42, a data line 41 and a power line 43. Second pixel 27 includes a plurality of transistors having a drive transistor 46, an anode electrode 45 connected to drive transistor 46, and a light emitting layer 44 positioned on anode electrode 45. A cathode electrode (not shown) is positioned on light emitting layer 44.

In second pixel 27, light emitting layer 44 and anode electrode 45 are positioned throughout the entire pixel region. Second pixel 27 displays a predetermined image in light emitting layer 44, corresponding to a data signal. That is, second pixel 27 is formed into a non-transparent structure in which a background is not observed.

FIG. 3A is a view showing a first pixel shown in FIG. 1, constructed as an embodiment according to the principles of the present invention. In FIGS. 3A and 3B, portions identical to those of FIG. 2 will be designated by like reference numerals, and their detailed descriptions will be omitted.

Referring to FIG. 3A, first pixel 23 is formed in a pixel region defined by a scan line 42, a data line 41 and a power line 43. Here, the pixel region is divided into a first section 57 in which an anode electrode 55 is formed, and a second section 56 in which anode electrode 55 is not formed.

A plurality of transistors having a drive transistor 46, anode, electrode 55 and a light emitting layer 54 are formed in first section 57. Here, anode electrode 55 is connected to drive transistor 46, and light emitting layer 54 is positioned on anode electrode 55. First section 57 is used to display a predetermined image corresponding to a data signal. That is, first section 57 is formed into a non-transparent structure in which a background is not observed.

Transistors, a light emitting portion and an anode electrode are not formed in second section 56. That is, a separate metal layer is not formed in second section 56, except a transparent insulating layer (e.g., a buffer layer) which is not shown in this figure. In this case, an observer can observe a background via second section 56. That is, second section 56 is formed into a transparent structure in which a background can be observed through second section 56.

Meanwhile, in the present invention, second section 56 is set to have a narrower area than first section 57. When second section 56 is set to have a narrower area than first section 57, an image displayed in first section 57 may be displayed to be observed by the observer.

Practically, the observer can observe a background via first area 24 having first pixel 23 formed therein. In this case, the cellular phone is applicable in various types. For example, the observer may take a photograph while observing a background. Also, the observer may obtain information of a background while observing the background in an augmented reality form.

FIG. 3B is a view showing a first pixel, constructed as another embodiment according to the principles of the present invention. In the present embodiment, an anode electrode 65 may be formed to overlap with scan line 42 and power line 43 as shown in FIG. 3B. At this time, a light emitting layer 64 is formed to overlap with scan line 42. When anode electrode 65 is overlapped with scan line 42 and power line 43, first area 57 can be more widely secured.

Figure 5:
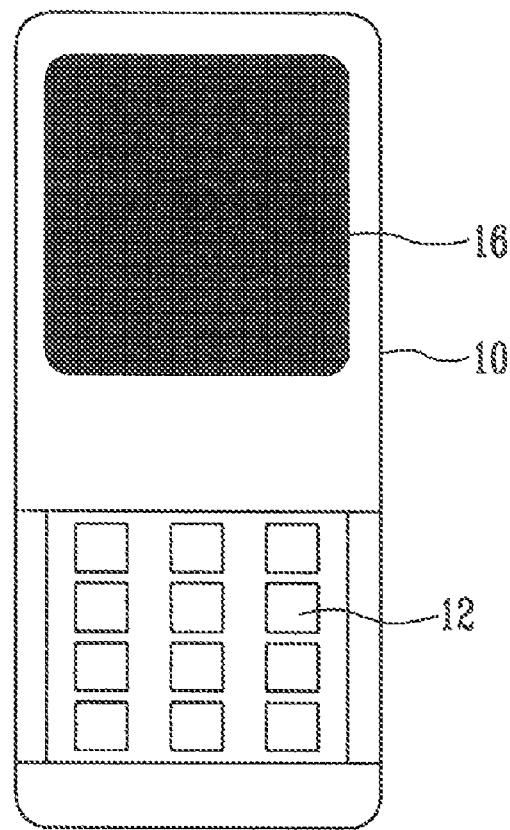
FIG. 5 is a view showing a first main body shown in FIG. 1A, constructed as an embodiment according to the principles of the present invention.

FIG. 5 is a view showing a first main body shown in FIG. 1A.

Referring to FIG. 5, first main body 10 has key pad 12 opened (i.e., exposed to the user) when second main body 20 is slid, and an area 16 overlapped with first area 24 of second main body 20 when second main body 20 is not slid. Here, area 16 overlapped with first area 24 is a portion that becomes a background of first area 24 when second main body 20 is not slid. Area 16 overlapped with first area 24 is set as black. When area 16 overlapped with first area 24 is set as black, a clearer image can be displayed in first area 24.

Figure 6:
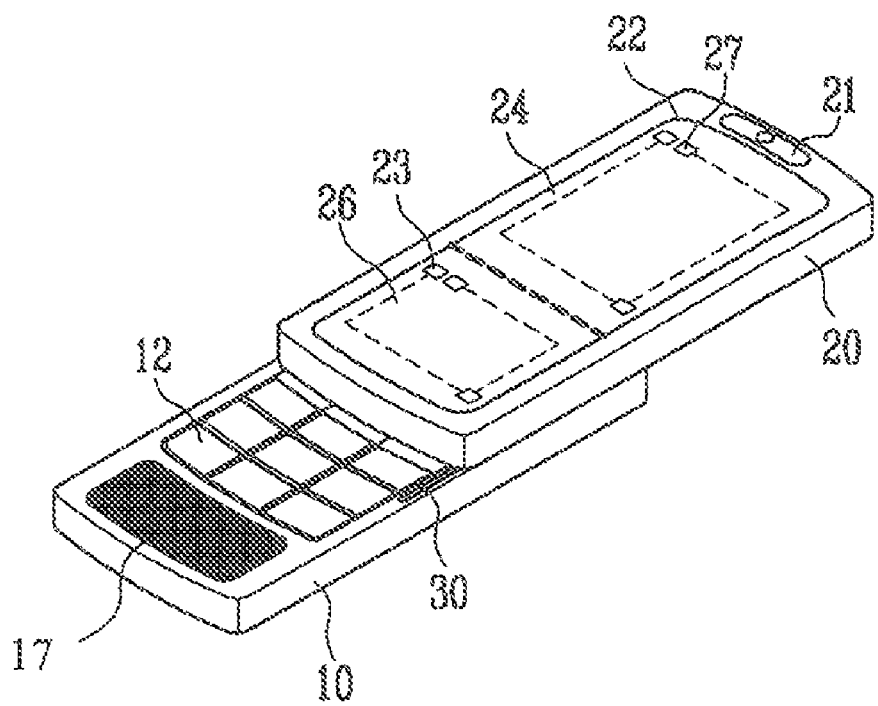
FIG. 6 is an oblique view showing a cellular phone constructed as another embodiment according to the principles of the present invention.

FIG. 6 is an oblique view showing a cellular phone constructed as another embodiment according to the principles of the present invention.

Although first area 24 is set as a transparent portion in the aforementioned embodiments, the present invention is not limited thereto. That is, as shown in FIG. 6, second pixels 27 may be formed in first area 24, and first pixels 23 may be formed in second area 26. In this case, second area 26 is set as a transparent portion, and first area 24 is set as a non-transparent portion.

Figure 7:
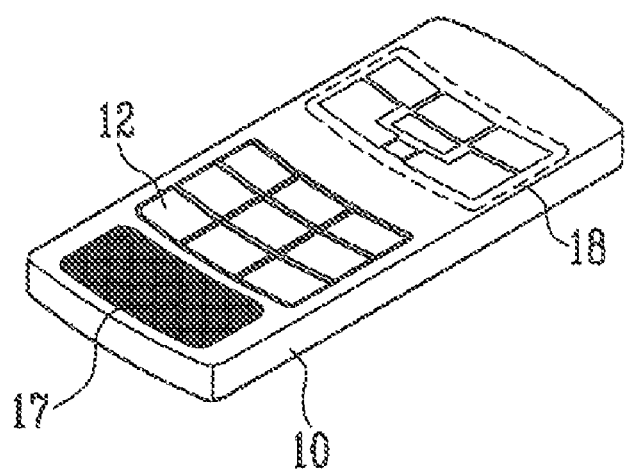
FIG. 7 is an oblique view showing a first main body shown in FIG. 6, constructed as an embodiment according to the principles of the present invention.
Figure 8:
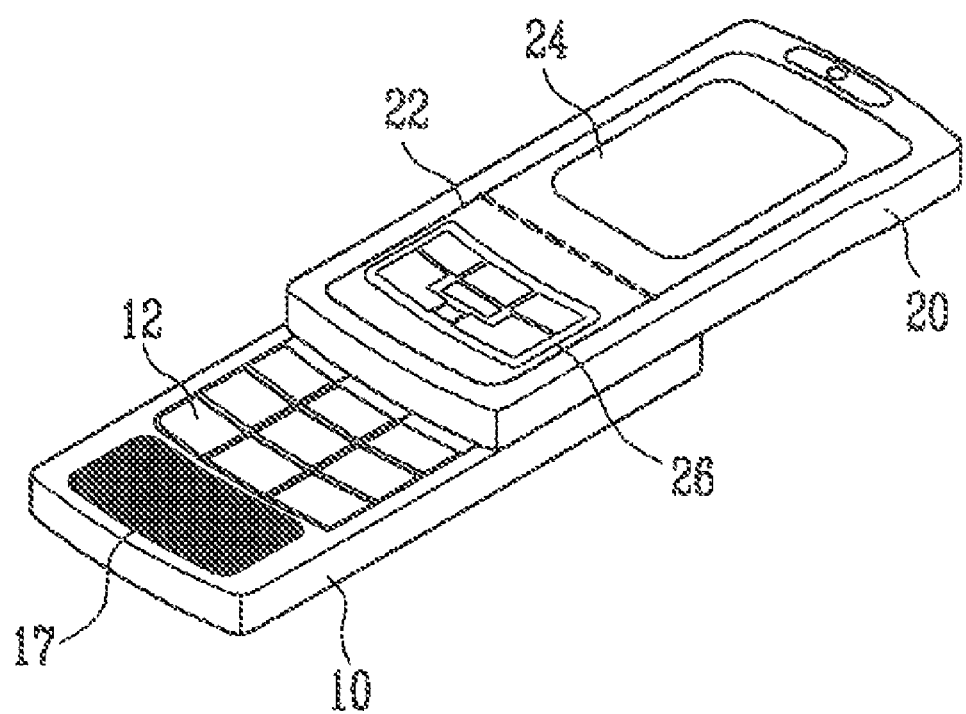
FIG. 8 is an oblique view of the cellular phone showing function keys displayed on a second area when the cellular phone of FIG. 6 is slidably open.

When second area 26 is set as a transparent portion, the shape of predetermined function keys is shown in an area 18 overlapped with second main body 20 when second area 26 is positioned on first main body 10 and second main body 20 is slid, as shown in FIG. 7. Then, when second main body 20 is slid, the function keys shown in area 18 overlapped with second main body 20 are observed as shown in FIG. 8. Thus, a predetermined function can be performed by touching some of the function keys. When second area 26 is positioned on first main body 10 and second main body 20 is not slid, an area 17 of first main body 10 overlapped with second area 26 is set as black. In this case, a clearer image can be displayed in second area 26 when second main body 20 is not slid.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A cellular phone, comprising:
   a first main body;
   a second main body slidably connected to the first main body; and
   a display provided to the second main body, the display being divided into a first area that is not overlapped with the first main body when the second main body is slidably open, and a second area that is overlapped with the first main body when the second main body is slidably open,
   the first area comprising first pixels formed into a transparent structure in which a background is observed through the first pixels, and the second area comprising second pixels formed into a non-transparent structure in which the background is not observed.

2. The cellular phone according to claim 1, wherein:
   at least one of the first pixels is positioned in a pixel area defined by a scan line, a data line and a power line; and
   the pixel area has a first section in which transistors, and anode electrode and a light emitting layer are formed, and a second section in which only a transparent insulating layer is formed.

3. The cellular phone according to claim 2, wherein the second section is set to have a narrower area than the first section.

4. The cellular phone according to claim 2, wherein the anode electrode formed in the second section is overlapped with the scan line and the power line, and the light emitting layer is overlapped with the scan line.

5. The cellular phone of claim 2, wherein the first section is non-transparent and the second section is transparent to allow a user to view an image behind a backside of the second main body by looking through the second section.

6. The cellular phone of claim 2, wherein the second section is absent of the light emitting layer and the anode electrode.

7. The cellular phone according to claim 1, wherein, when the second main body is not slidably open, an area overlapped with the first area in the first main body is set as black.

8. The cellular phone according to claim 1, wherein at least one of the second pixels is positioned in a pixel area defined by a scan line, a data line and a power line, and transistors, an anode electrode and a light emitting layer are formed in the pixel area.

9. The cellular phone of claim 1, wherein the user can look through the first area and observe an object on a back side of the first area from a front of the first area of the second main body when the second main body is slidably open.

10. The cellular phone of claim 1, wherein the second area comprises an organic light emitting display.

11. A cellular phone, comprising:
    a first main body;
    a second main body slidably connected to the first main body; and
    a display provided to the second main body, the display being divided into a first area that is not overlapped with the first main body when the second main body is slidably open, and a second area that is overlapped with the first main body when the second main body is slidably open,
    the first area comprising second pixels formed into a non-transparent structure in which a background is not observed, and the second area comprising first pixels formed into a transparent structure in which the background is observed through the first pixels.

12. The cellular phone according to claim 11, wherein:
    at least one of the first pixels is positioned in a pixel area defined by a scan line, a data line and a power line; and
    the pixel area has a first section in which transistors, and anode electrode and a light emitting layer are formed, and a second section in which only a transparent insulating layer is formed.

13. The cellular phone according to claim 12, wherein the second section is set to have a narrower area than the first section.

14. The cellular phone according to claim 12, wherein the anode electrode formed in the second section is overlapped with the scan line and the power line, and the light emitting layer is overlapped with the scan line.

15. The cellular phone of claim 12, wherein the first section is non-transparent and the second section is transparent to allow a user to view an image behind a backside of the second main body by looking through the second section.

16. The cellular phone of claim 12, wherein the second section is absent of the light emitting layer and the anode electrode.

17. The cellular phone according to claim 11, wherein, when the second main body is not slidably open, an area overlapped with the second area in the first main body is set as black.

18. The cellular phone according to claim 11, wherein, when the second main body is slidably open, the shape of predetermined function keys is shown in an area overlapped with the second area in the first main body.

19. The cellular phone according to claim 11, wherein at least one of the second pixels is positioned in a pixel area defined by a scan line, a data line and a power line, and transistors, an anode electrode and a light emitting layer are formed in the pixel area.

20. The cellular phone of claim 11, wherein the user can look through the second area and observe an object on a back side of the second area from a front of the second area of the second main body when the second main body is slidably open.

* * * * *